United States Patent [19]

Watanabe

[11] Patent Number: 5,443,931
[45] Date of Patent: Aug. 22, 1995

[54] PHOTO MASK AND REPAIR METHOD OF THE SAME

[75] Inventor: Hisashi Watanabe, Nagaokakyo, Japan

[73] Assignee: Matsushita Electronics Corporation, Osaka, Japan

[21] Appl. No.: 40,495

[22] Filed: Mar. 31, 1993

[30] Foreign Application Priority Data

Mar. 31, 1992 [JP] Japan .................................. 4-076708

[51] Int. Cl.⁶ ............................................... G03F 9/00
[52] U.S. Cl. ......................................... 430/5; 430/324; 430/325
[58] Field of Search .................... 430/5, 296, 322, 324, 430/325, 326, 942; 378/35

[56] References Cited

U.S. PATENT DOCUMENTS

3,748,975  7/1973  Taraboccia ............................ 430/5
4,751,169  6/1988  Behringer et al. .................... 430/5

Primary Examiner—Steve Rosasco
Attorney, Agent, or Firm—Ratner & Prestia

[57] ABSTRACT

A light-shield film pattern and a phase shifter are formed on a transparent substrate. An applied oxide film is used as the phase shifter. On this phase shift mask, a phase shifter defect is present. On the phase shift mask containing the phase shifter defect, a silicon-containing resist is applied. At this time, the film thickness of the resist is 50 nm in the flat part. Herein, the phase shifter defect is supposed to be a bump defect. When the resist is formed in a film thickness of 50 nm, the phase difference of the light entering through the film thickness is about 30 degrees. This resist is exposed with electron beam in a region including the periphery of the defect. After electron beam exposure, it is developed. Since the silicon-containing resist is a negative resist, only the region irradiated with electron beam is left over after development. Since the resist has a mild slope, if exposed using this phase shift mask, the bump defect will not be projected. Thus, when the both sides of the bump defect are dull, if the defect height is more than the height of providing the light with a phase difference of 180 degrees, it will not be projected. When the both sides of the bump defect are moderate, the incident light also changes moderately in phase. In this case, the pattern is not projected.

14 Claims, 8 Drawing Sheets

PHOTO MASK AND REPAIR METHOD OF THE SAME

BACKGROUND OF THE INVENTION

1. Field of the Invention

The present invention relates to a photo mask used in photo lithography and a repair method of the same.

2. Description of the Related Prior Art

In a projection exposure apparatus for irradiating a photo mask on which an original pattern is drawn by an illuminating system, and projecting the pattern on the mask onto a wafer, the pattern to be projected is demanded to be higher in definition. As the method for realizing higher definition, recently, a method of using a phase shift mask for applying a phase difference to the exposure light is being noticed.

Figure 11:
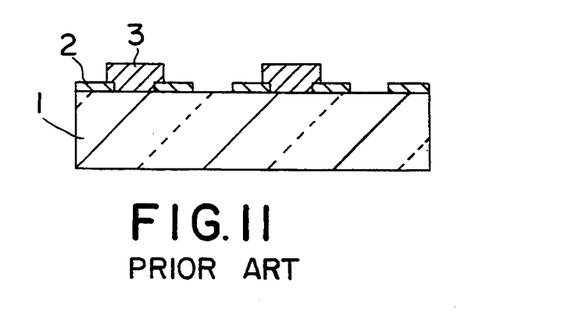
FIG. 11 shows a diagram for explaining a conventional phase shift mask repair method.

The phase shift mask is explained by reference to FIG. 11.

To provide exposure light with a phase difference, the photo mask is composed of a light-shield pattern 2 and a phase shifter 3 formed on a transparent substrate 1. The phase shifter 3 is a pattern using transparent film for applying a phase difference of 180 degrees to the transmission light into the phase shift mask. Using the phase shift mask of such structure, a finer resist pattern on the wafer can be formed. The phase shift mask is complicated in structure as compared with the conventional photo mask composed only of light-shield film pattern, and strict control is required in the thickness of the transparent film, refractive index, etc.

In particular, if there is a defect in the transparent film pattern, it is difficult to repair it.

Hitherto, as the defect repair method of such transparent film pattern, a method presented in the collected papers for the 51st General Meeting of Japan Society of Applied Physics, 27p-ZG-10,p. 493 (1990) has been proposed. This is a method using a transparent film for mask repair preliminarily on a mask substrate. Another method is proposed in the collected papers for the 52nd General Meeting of Japan Society of Applied Physics, 12p-ZF-5, p. 605 (1991). This is a method of etching the defect of the transparent film using a focused ion beam (FIB).

Figure 12A:
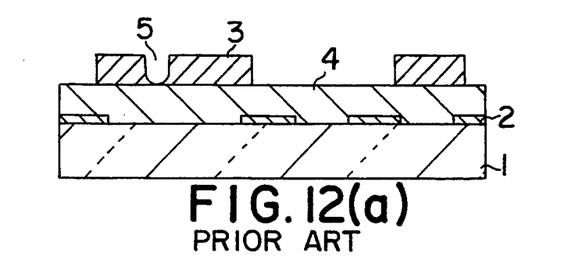
FIGS. 12(a)(b)(c) shows a diagram for explaining a conventional phase shift mask repair method.
Figure 12B:
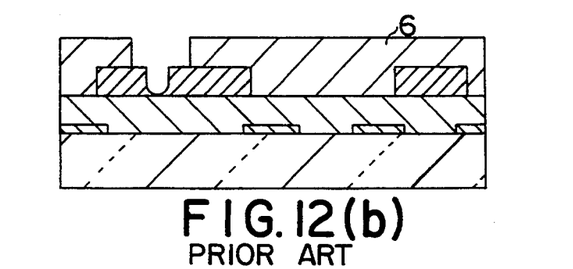
Figure 12C:
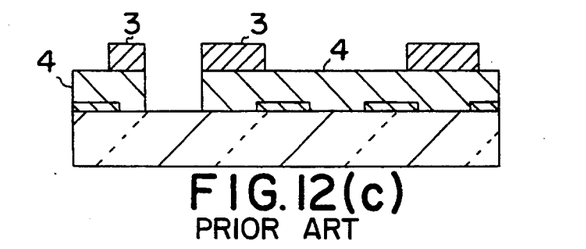

The former method of repair using the transparent film is explained by referring to FIG. 12. A light-shield film pattern 2 is formed on a transparent substrate 1. Further thereon is formed a transparent film for applying a phase difference of 180 degrees to the transmission light, which is called a sub-shifter 4. A transparent film pattern is formed thereon as a phase shifter 3. A dent defect 5 is formed in the phase shifter 3 (FIG. 12 (a)). A resist 6 is applied on the entire surface of the transparent substrate 1, and the window of the resist 6 is formed in a region including the periphery of the defect 5 by exposure and development (FIG. 12 (b)). Later, using this resist 6 as a mask, the phase shifter 3 and sub shifter 4 are removed by dry etching (FIG. 12 (c)). In this process, the phase of the light passing through the etched region is same as in ordinary exposure. On the other hand, the light passing through the phase shifter 3 is provided with a phase difference there, and when passing through the sub-shifter 4, a further phase difference of 180 degrees is given. That is, the light passing through the phase shifter 3 is delayed in phase by 180 degrees, and is further delayed in phase by 180 degrees in the sub-shifter 4. In total, the phase is delayed by 360 degrees. It means it is in phase with the light passing through the region free from phase shifter 3 and sub-shifter 4 by etching. The light passing through only the sub-shifter 4 without passing the phase shifter 3 is delayed in phase by 180 degrees as compared with the above light.

The method of repair using the FIB is described below by reference to FIG. 13. A light-shield film pattern 2 is formed on a transparent substrate 1. A transparent film pattern is formed thereon as a phase shifter 3. The phase shifter 3 has a dent defect 5 (FIG. 13(a)). The region including this defect 5 is selectively removed by ion milling using gallium (Ga) ion beam 7. At this time, the transparent substrate 1 is also etched by ion milling. The etching depth at this time is set at such a depth that the phase of the light passing through the etching region may be advanced by 180 degrees.

In the prior art shown in FIG. 12, in order to remove the defect 5 selectively, a resist is applied on the defect 5, and the specified portion is exposed and developed to form a resist pattern. Afterwards, using this resist pattern as the mask, the phase shifter 3 and the sub-shifter layer 4 are dry etched, and then the resist is removed. In this method, however, the mask repair process is complicated.

Figure 13A:
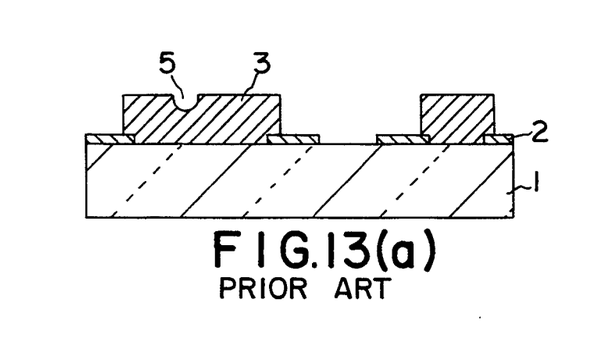
FIG. 13(a)(b) shows a diagram for explaining a conventional phase shift mask repair method.
Figure 13B:
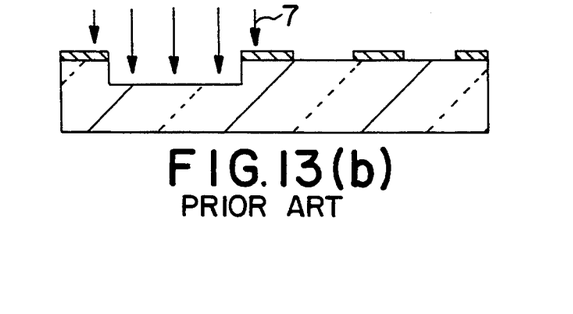

The phase shift mask repair method shown in FIG. 13 involves problems in the etching depth or flatness by etching of the ion beam 7, and controllability of etching shape, among others. Herein, the etching depth must be within a fluctuation of 10%, in phase difference, and the depth fluctuation must be (within 5%. The light transmissivity in the etching region is required to be 95%, or more. That is, after etching, the substrate surface must be flat and transparent. Besides, the film thickness to be etched determines the phase difference applied to the transmission light, and hence it is necessary to etch accurately and uniformly. At the present, it is difficult to obtain such precision by the processing with ion beam 7.

SUMMARY OF THE INVENTION

The invention presents a photo mask comprising a transparent substrate, a light-shield film pattern formed on the transparent substrate, and a transparent film for providing transmission light with a phase difference formed on the transparent substrate or the light-shield film pattern, wherein a transparent photosensitive resin is formed at least on a defect existing in the transparent film.

The invention also presents a photo mask comprising a transparent substrate, a light-shield film pattern formed on the transparent substrate, and a transparent film for providing-transmission light with a phase difference formed on the transparent substrate or the light-shield film pattern, wherein a transparent photosensitive resin is formed in the transparent film region having a dent defect existing in the transparent film.

The invention moreover presents a photo mask comprising a transparent substrate, a light-shield film pattern formed on the transparent substrate, and a transparent film for providing transmission light with a phase difference formed on the transparent substrate or the light-shield film pattern, wherein a transparent photosensitive film is formed so as to completely cover a dent defect existing in the transparent film.

The invention presents a method of repair of photo mask comprising the steps of applying a transparent photosensitive resin on a photo mask having a light-shield film pattern and a transparent film for providing transmission light with a phase difference provided on a transparent substrate, exposing a specified region, and developing, thereby forming a photosensitive resin pattern on the substrate.

According to the invention, a defect on a phase shift mask can be repaired easily and at high controllability.

BRIEF DESCRIPTION OF THE DRAWINGS

FIGS. 9(a)(b)(c) shows a diagram for explaining the phase shift mask.

DESCRIPTION OF THE PREFERRED EMBODIMENTS

A phase shift mask provides the opening, which is a transparent part adjacent to neighboring light-shield film patterns, with a phase difference of 180 degrees. As a result, a pattern that cannot be resolved by a conventional photo mask can be formed. In the same principle, if there is a transparent film that provides a phase difference of 180 degrees in an undesirable area on the phase shift mask, the pattern by the transparent film is projected on the wafer.

Such undesirable transparent film pattern (hereinafter called phase shifter defect) is more easily projected than the defect of the light-shield film. Hence, in the phase shift mask, the repair technology for eliminating the phase shifter defect is very important.

Phase shifter defects on the phase shift mask are classified into two types. One is a defect sharply swelling up in the transparent portion as compared with the plane of the peripheral parts (hereinafter called a bump defect). The bump defect generally occurs as the remainder of etching or the like when forming a phase shifter. The second is a defect lower than the plane of the peripheral parts (hereinafter called a dent defect). The dent defect is generally a pin hole of phase shifter.

To repair these defects, the bump defect must be cut off completely to be flush with the peripheral parts. The dent defect must be filled to the height same as the plane of the peripheral parts using a transparent film equivalent in optical characteristics for the peripheral parts, or to a height having a phase difference of 360 degrees to the peripheral parts. It is, however, extremely difficult to process the delicate phase shifter formed on the phase shift mask.

The basic concept of the invention is to fill up the defect to a desired thickness by exposing a specific part after applying a photosensitive resin by spinning.

When exposed using a phase shift mask having a dent defect and a bump defect, demerits occured the projection are same, but the method of repairing the defects is different. The method of repair also differs by when the defects are present among fine patterns that cannot be formed using a conventional photo mask, or when the defects are isolated from the other patterns on the mask. If the defects are among fine patterns, the region having the defects must be inverted from the phase of the light passing through the neighboring fine patterns. On the other hand, if the defects exist among patterns with a sufficient width which could be formed using a conventional photo mask, or independently, the phase difference would not be necessary, These points are explained in detail below by referring to the embodiments.

Figure 1A:
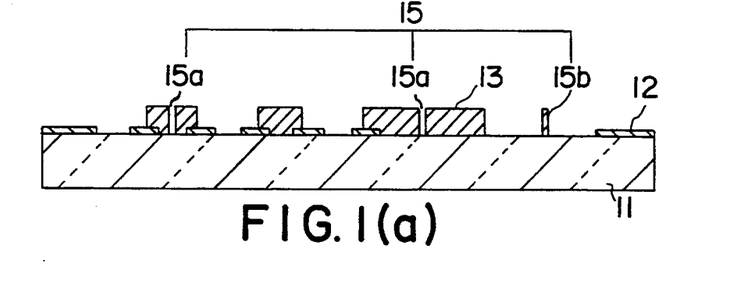
FIGS. 1(a)(b)(c) shows a diagram for explaining a phase shift mask repair method of the invention.
Figure 1B:
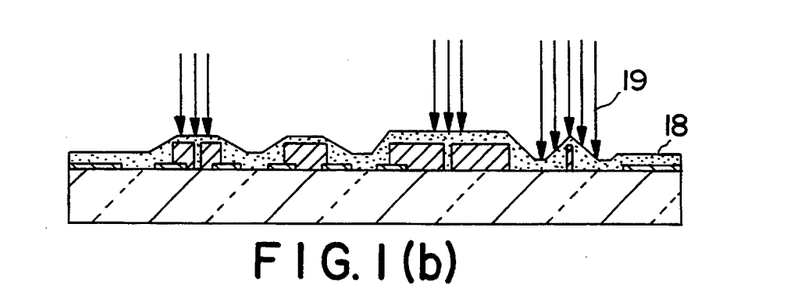
Figure 1C:
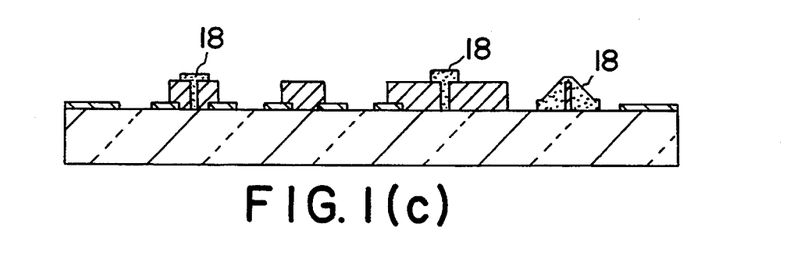

Some of the embodiments for the mask repair method of the invention are described in detail below. FIG. 1 is a sectional process diagram showing a first embodiment of a photo mask repair method according to the invention. FIG. 1 shows a transparent substrate 11 which is a quartz substrate of five-inch square, a light-shield film pattern 12 which is a chromium film having a film thickness of 80 nm. Also included is a phase shifter 13 which is a coated oxide film of 420 nm in thickness. A phase shifter defect 15 is present on this phase shift mask (FIG. 1 (a)).

What is called the phase shifter defect 15 herein is a transparent defect on the phase shift mask. The phase shifter defect 15 is classified into a dent defect 15a which is a defect that the phase shifter is not present in the supposed position, and a bump defect 15b which is a defect located at a position not supposed to be present. The mask is repaired so that these two defects 15 may not be projected at the time of projection.

A silicon-containing resist 18 is applied on a phase shift mask including the phase shifter defects 15. At this time, the film thickness of the resist 18 is 50 nm on the flat part of the transparent substrate 11 (FIG. 1 (b)). Herein, the phase shifter defect 15 is supposed to be the bump defect 15b. The silicon-containing resist 18 used herein is the resist invented by the present inventor as disclosed in the Japanese Patent Application Hei. No. 3-127776.

Figure 2A:
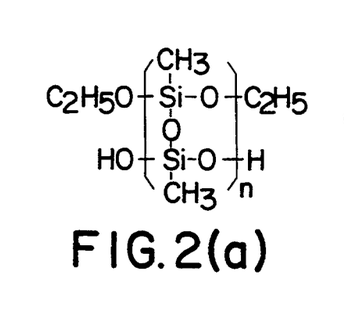
FIGS. 2(a)(b) shows a diagram expressing the composition of an electron resist used in phase shift mask repair of the invention.
Figure 2B:
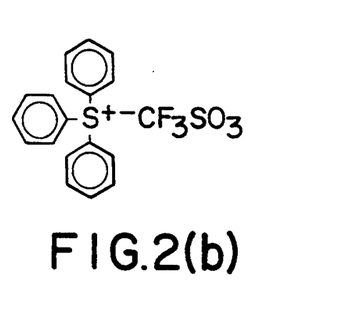

This silicon-containing resist 18 is described briefly by referring to FIG. 2. The silicon-containing resist 18 is mainly composed of a ladder type siloxane polymer having an ethoxy group and a hydroxy group at end groups and a methyl group in the side chain as shown in FIG. 2 (a). As its photosensitizer, 2 parts by weight of triphenyl sulfonium triphosphate is contained as shown in FIG. 2 (b). This resist 18 is transparent to the light having a longer wavelength than deep ultraviolet ray. This is a negative type resist for electron beam and deep ultraviolet ray excellent in chemical resistance and heat resistance.

When the resist 18 is formed in a film thickness of 50 nm, the phase difference of the incident light by the film thickness is about 30 degrees. This resist 18 is exposed by an electron beam 19 at acceleration voltage of 20 kV, by the exposure dose of 0.3 $\mu C/cm^2$ in a region including the periphery of the defect 15. After electron beam exposure, it is developed by immersing in an aqueous solution of tetramethyl ammonium hydroxide (concentration 8%) for 60 seconds. Since the silicon-containing resist 18 is a negative resist, only the region irradiated with electron beam 19 is left over after development. This mode is shown in FIG. 1 (c). Thus, a desired pattern is formed.

Figure 3A:
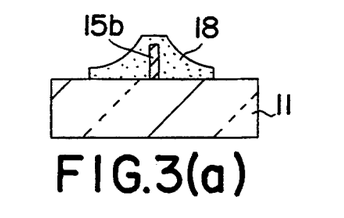
FIGS. 3(a)(b) shows a diagram for explaining a phase shift mask repair method of the invention.
Figure 3B:
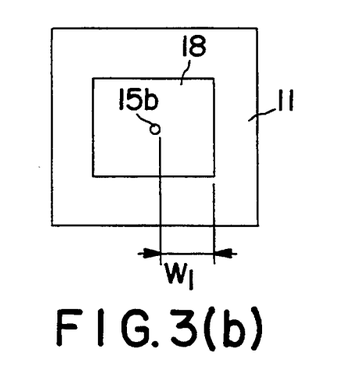

The pattern of the resist 18 formed in such bump defect 15a is shown in FIG. 3 (a). The pattern of resist 18 is formed as inclined patterns at both sides of the peak of the bump defect 15b. FIG. 3 (b) shows a plan view of the phase shift mask of FIG. 3 (a). The bump defect 15b is in the middle of the phase shift mask. At this time, the exposed region of the resist 18 is formed at a distance remote from the bump defect 15b by W1. Herein it is exposed so that the width W1=2.5 um. When thus remote from the position of the defect 15, the bump defect 15b is processed so that the shape of the defect may be moderate in its height. Thus, by providing the resist 18 with a moderate slope, if exposed using this phase shift mask, the bump defect 15a will not be projected. In this way, when both sides of the bump defect 15a are made moderate, if the height of the defect 15 is enough to provide the light with a phase difference of 180 degrees, it will not be projected. If the both sides of the bump defect 15a are moderate, the incident light also changes in phase moderately. In this case, the pattern is not projected.

Figure 4A:
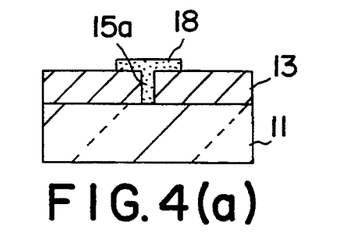
FIGS. 4(a)(b) shows a diagram for explaining a phase shift mask repair method of the invention.
Figure 4B:
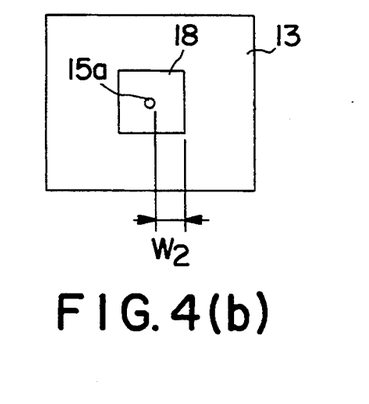

Explained next is a case in which the type of the phase shifter defect 15 is a dent defect 15a. As shown in FIG. 4 (a), the periphery of the defect 15 in a wider range than the region of the defect is exposed. FIG. 4 (b) shows a plan view of the phase shift mask in FIG. 4 (a). The dent defect 15a is formed in the middle of the phase shift mask. At this time, the region of the resist 18 to be exposed is formed at a distance of W2 from the dent defect 15a. Herein, the exposure is in the width of W2=1.0 μm. Finally, by heat treatment for 30 minutes at 220 deg. C, the unreacted hydroxyl group and ethoxy group are completely reacted to stabilize.

In this method, the dent defect 15a is nearly in phase with the peripheral parts, and the defect is not projected. Using this mask, as a result of exposure using i-ray stepper (magnification 5 times, numerical aperture NA=0.5), the defect projected on the resist before repair was confirmed not to be projected after repair, so that a desired pattern was formed.

This method realizes easily the repair of the dent defect 15a in the fine line and space pattern of, for example, about 0.3 to 0.5 μm, that cannot be formed without the phase shifter 13.

Needless to say, in a similar method, without phase shifter 13, it is possible to expose using an conventional photo mask. For example, in a relatively larger pattern of 0.5 μm or more, both dent defect 15a and bump defect 15b may be repaired at the same time.

The minimum dimension R that can be formed by exposure using an conventional photo mask is R=0.6×λ/NA, supposing the numerical aperture of the exposure euipments to be NA and the exposure wavelength to be λ. On the other hand, using the phase shifter 13, a resist pattern of up to R=0.4×λ/NA can be formed.

In this method, however, it is difficult to repair the bump defect 15b in a fine line and space pattern of 0.3 to 0.5 μm. That is, the phase difference is deviated in the bump phase 15b in the fine line and space pattern because the fine pattern is formed using the phase difference between neighboring patterns in the phase shift mask. Whether in dent defect 15a or in bump defect 15b, the effect due to the defect 15 deviated in phase by 180 degrees is the greatest. Usually, the defect 15 formed in fabrication of the phase shift mask is often formed when forming the phase shifter 13. Accordingly, there are many defects 15 causing a phase difference of 180 degrees. At this time, as the phase difference given by the defect 15 becomes remote from 180 degrees, the projection in exposure due to defect 15 is smaller. In particular, the defect 15 giving a phase difference of only 45 degrees hardly affects the projection.

In this way, in the bump defect 15b causing a phase difference of 180 degrees, the effect of the phase shifter 13 is not enough, and the pattern is hardly resolved.

Herein, the film thickness of the silicon-containing resist 18 for repair is 50 nm in order to provide the transmission light with a phase difference of 30 degrees, but this film thickness is not limitative. Yet, if the phase difference is 90 degrees or less, its pattern is not projected, and the film thickness may be selected accordingly.

Or, if the coating film thickness is too thin, when the resist 18 is applied, the resist 18 may not be left over in the step part on the transparent substrate 11. It is hence desired to keep the film thickness of the resist 18 not less than 5 nm. More specifically, when repairing the phase shift mask using this method, the film thickness of the photosensitive resin applied for repair is 5 nm or more, and it should be such a film thickness as to provide the transmission light with a phase difference of 90 degrees or less, and in particular it is desired that the phase difference applied to the transmission light be 45 degrees or less.

Figure 5A:
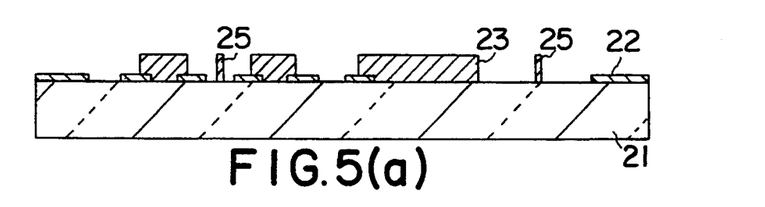
FIGS. 5(a)(b)(c) shows a diagram for explaining a phase shift-mask repair method of the invention.
Figure 5B:
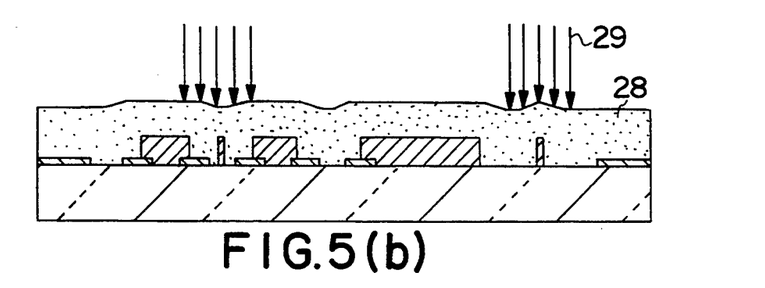
Figure 5C:
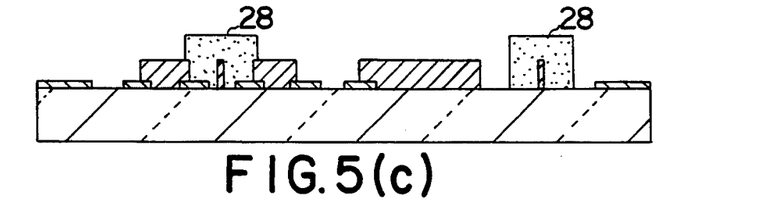

Referring now to FIG. 5, a second embodiment is described in detail below.

The phase shift mask shown in FIG. 5 (a) has bump defects 25 in a fine repetitive pattern that cannot be formed by the ordinary exposure not provided with phase shifter 23. As mentioned above, it is difficult to repair such defect by the method shown in the first embodiment. The phase shift mask used herein is similar to the one used in the first embodiment, but as the phase shifter 23, instead of coating oxide film (SOG), the silicon-containing resist shown in FIG. 2 was used. When this resist is used as the phase shifter 23, as compared with the case of using the coating oxide film as the phase shifter 23, the pattern can be formed only by development without employing dry etching in formation of pattern of the phase shifter 23, so that the fabrication of the phase shift mask is facilitated.

As shown in FIG. 5 (b), the silicon-containing resist 28 is applied on the phase shift mask including the phase shifter defect 25 in a film thickness of 840 nm in the flat part of the transparent substrate 21. This film thickness is to provide the light transmitting the phase shifter 23 with a phase difference of 360 degrees. Herein, as the silicon-containing resist 28 for repair, the resist as shown in FIG. 2 was used same as in the first embodiment.

This resist is exposed by electron beam 9 at acceleration voltage of 20 kV, and the region including the peripheral part of the phase shifter defect 25 is exposed by electron beam 29. The phase shifter defect 25 in the repetitive pattern is exposed so that the end of the exposure region may be overlapped with the peripheral light-shield film pattern 22. The isolated phase shifter defect 25 was exposed in a width of 1.0 μm including the peripheral part of the defect. After exposure with electron beam 29, it was developed by immersing for 60 seconds in an aqueous solution of tetramethyl ammonium hydroxide (concentration 8%). Since the silicon-containing resist 28 is a negative resist, only the portion irradiated with electron beam 29 is left over (FIG. 5 (c)).

The pattern after repair of the bump defect in repetitive pattern has a phase difference of 360 degrees to the portion free of the phase shifter 23, and has a phase difference of 180 degrees to the adjacent phase shifter 23. Therefore, the neighboring openings always have a phase difference of 180 degrees, thereby exhibiting the function as the phase shift mask sufficiently.

The isolated phase shifter defect 25 is filled up with the applied silicon-containing resist 28. In this case, by electron beam exposure, the pattern left over after development has a phase difference of 360 degrees to the peripheral parts.

As a result of exposure using the i-ray stepper with this mask, the defect projected on the resist before repair was not projected after repair, and a desired pattern was formed. In this method, the resist 28 is not moderate on both sides of the defect, concerning the bump defect as shown in FIG. 3, because the resist application condition is different between FIG. 3 and FIG. 5.

By this method, repair of the bump defect in a fine line and space pattern (0.3 to 0.5 μm) that cannot be formed without the phase shifter 23, or repair of dent defect and bump defect existing in a relatively large pattern (0.5 μm or more) that can be formed by ordinary exposure without phase shifter 23 can be done at once.

Herein, the silicon-containing resist 28 for repair is formed in such a film thickness (840 nm) as to provide the transmission light with a phase difference of 360 degrees, but it is difficult to control the film thickness accurately on a step.

Figure 6:
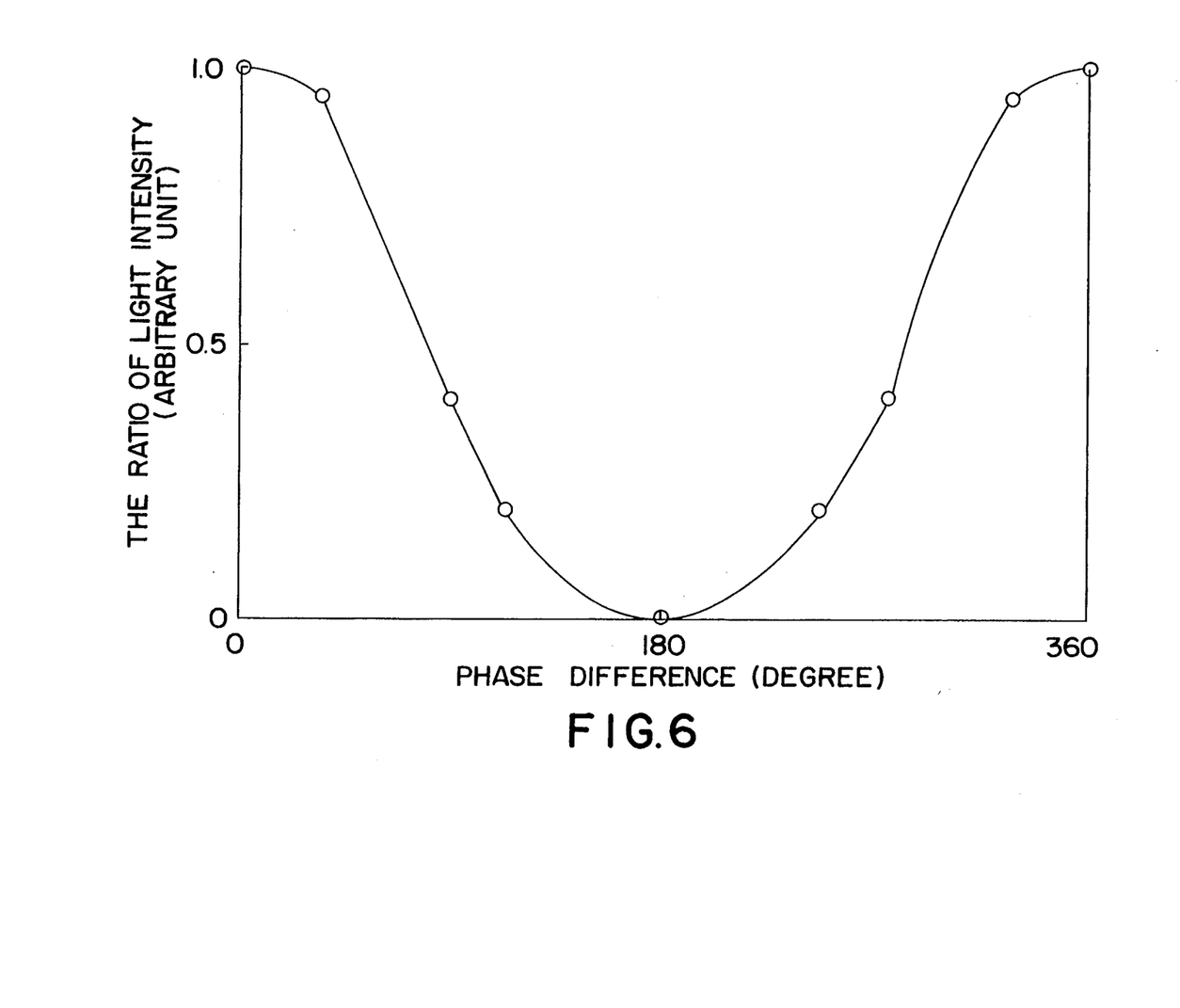
FIG. 6 shows a diagram for explaining the relation between light intensity ratio and phase difference of phase shift mask after the repair method of the invention.

FIG. 6 shows the result of simulating the relation of light intensity ratio and phase difference by phase shifter. Up to 300 degrees when the phase difference changes by 60 degrees, the light intensity is 95% or more. It is hence known to be permissible as far as the fluctuation of film thickness is about 60 degrees as converted to the phase difference.

When repairing the phase shift mask in this method, the film thickness of the photosensitive resin to be applied for repair may be such that a phase difference of 300 degrees or more and 420 degrees or less be applied to the transmission light.

Figure 7A:
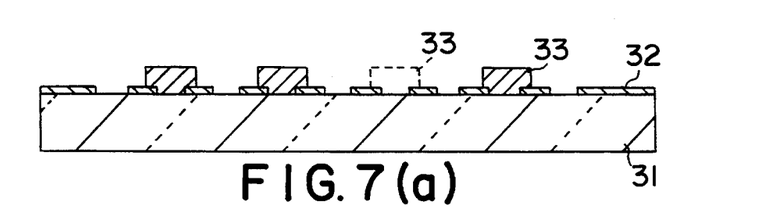
FIGS. 7(a)(b)(c) shows a diagram for explaining a phase shift mask repair method of the invention.
Figure 7B:
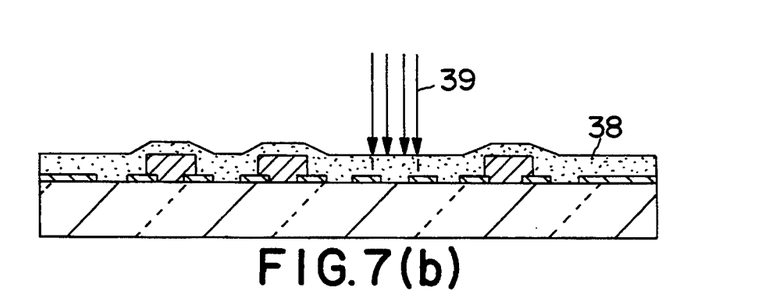
Figure 7C:
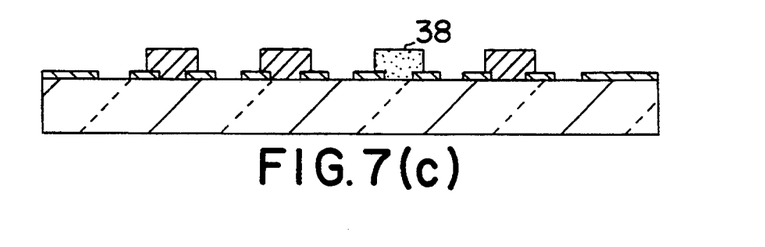

In the methods of these two embodiments, various bump defects and dent defects can be repaired. In these methods, however, it is difficult to repair a defect that a supposed phase shifter pattern is not present as shown in FIG. 7. A third embodiment to-solve this problem is described in detail below by reference to FIG. 7.

The third embodiment relates to a method of repairing the missing shifter 30. The phase shift mask used herein is almost same as the one used in the second embodiment. As the phase shifter 33, a silicon oxide film formed by sputtering is used. The phase shifter 33 is formed between light-shield films 32 adjacently. The silicon oxide film is superior to the applied oxide film in heat resistance and chemical resistance. On the phase shift mask containing the missing shifter 30 (FIG. 7 (a)), a photosensitive resin 38 is applied on a flat part of a transparent substrate 31 in a resist film thickness of 420 nm. With this film thickness, a phase difference of 180 degrees is given to the transmission light. Herein, as the photosensitive resin for repair, chloromethylated polydiphenyl siloxane is used. As shown in FIG. 7 (b), a spot exposure of ultraviolet ray 31 is emitted to the defective portion of the missing shifter 30. After exposure, a developing solution mixing methyl ethyl ketone and isopropyl alcohol 1 by 1 is sprayed for 30 seconds to develop. Then it is rinsed in isopropyl alcohol solution. Since this resist is also a negative resist, only the portion illuminated with the ultraviolet ray 31 is left over, and the rest is dissolved in the developing solution. As a result, a resist is formed as a phase shifter in the position of the missing shifter 30 as shown in FIG. 7 (c).

As a result of exposure by the i-ray stepper using this phase shift mask, a 0.3 um line and space pattern not formed before repair was formed. Using this method, it is possible to repair the missing shifter 30 in the fine line and space pattern (0.3 to 0.5 μm) that cannot be formed by ordinary exposure without phase shifter.

Herein, the resist for repair is in such a film thickness (420 nm) as to provide the transmission light with a phase difference of 180 degrees. It is most desired to have such a film thickness as to provide a phase difference of 180 degrees, but it is difficult to control the film thickness accurately on a step.

As a result of the simulation on such phase shift mask, the fluctuation of the film thickness is found to be permitted up to 30 degrees as converted to the phase difference. Therefore, when repairing the phase shift mask in this method, the film thickness of the photosensitive resin to be applied for repair is desired to be a film thickness for providing the transmission light with a phase difference of 150 degrees or more and 210 degrees or less.

Figure 8A:
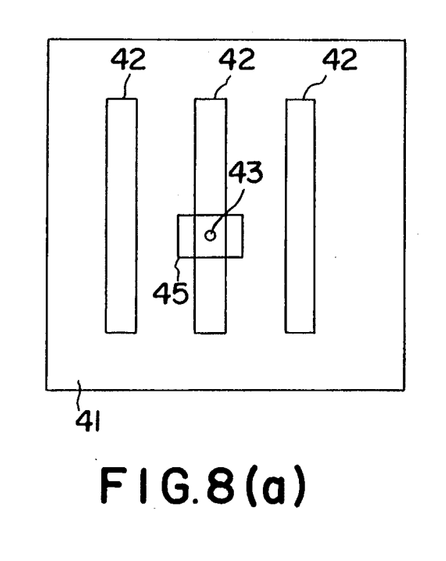
FIG. 8 shows a diagram for explaining the allowable range of fluctuation of film thickness in the repair part.
Figure 8B:
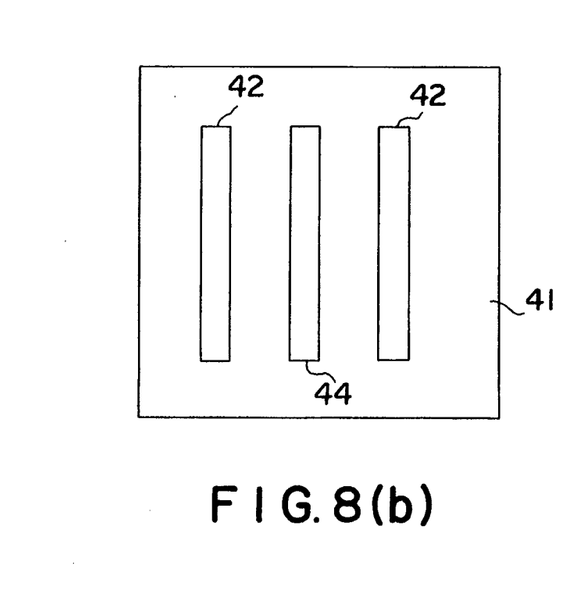

In this case, it is different from the result of simulation shown in FIG. 6, which is explained by reference to FIG. 8. FIG. 8 (a) is a plan view of a phase shift mask for repairing the defect explained above. FIG. 8 (b) is a plan view of a phase shift mask for repairing a missing shifter. In a phase shift mask 41 in the drawing, a rectangular phase shifter 42 is formed herein. The phase shifter 42 has a defect 43. Or there is a missing shifter 44. In the case of an ordinary defect 43, the repaired region is a peripheral region 45 containing the defect 43, but in the case of the missing shifter 44, one pattern of the phase shifter 42 is restored entirely. Thus, the repaired area differs between the defect 43 and missing phase 44, and therefore the allowable range of fluctuations of the film thickness differs individually.

In the three methods mentioned herein, the phase shifter defect on the phase shift mask can be repaired. In the phase shift mask, if the end of the phase shifter (the portion for offering a phase difference of 180 degrees) is present in the light transmission region enclosed by the light-shield film pattern, the end of the phase shifter function as the light-shield part. However, using such function, a fine pattern can be formed, but, to the contrary, the end of the phase shifter may be present in the opening part which is the light transmission region depending on the mask layout. In this case, the unnecessary pattern may be projected onto the wafer. To erase such undesired pattern, the present inventor proposed, in the Japanese Patent Application Hei. 3-93889, a phase shift mask capable of varying the phase in steps at the end of the phase shifter. More specifically, it is a method of varying the phase gradually by gradually changing the film thickness of the phase shifter in its end portion.

To vary the film thickness gradually in this way, the exposure dose for pattern exposure is gradually varied at the time of forming the phase shifter.

In succession, other method of gradually varying the film thickness in the end portion of the phase shifter easily is explained below by reference to FIG. 9.

The phase shift mask used herein is almost same as the one used in the first embodiment. As a phase shifter 53, an applied oxide film (SOG) was used.

Figures 9A, 9B, 9C:
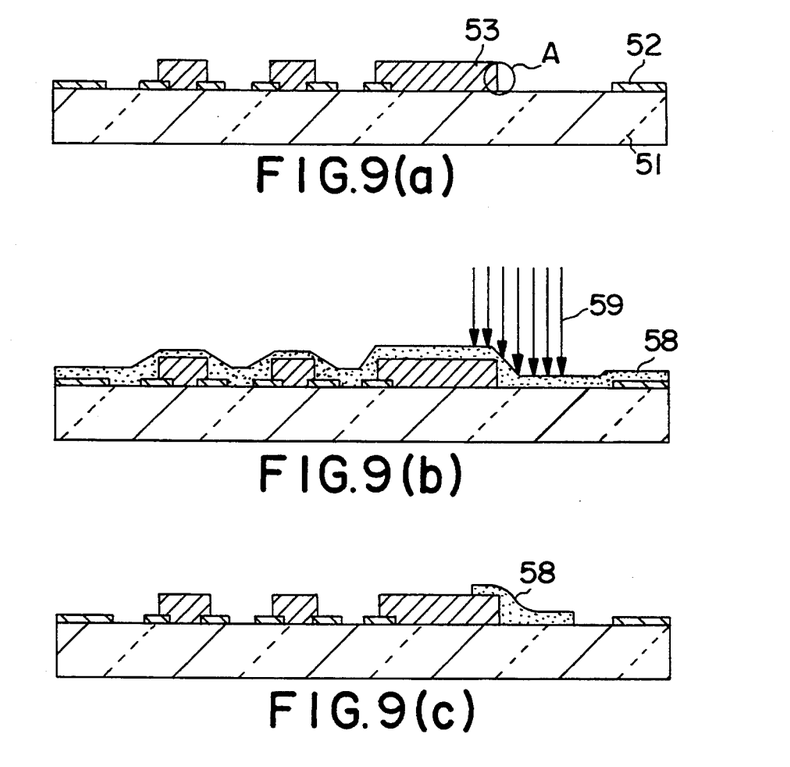

The phase shift mask shown in FIG. 9 (a) contains the end (A) of the phase shifter 53 in the light transmission area. This end A has its pattern projected on the wafer by the light passing through the end A when exposed using this phase shift mask. By design, if such pattern is not necessary substantially, the end A of the phase shifter 53 existing in the light transmission area may be regarded as a defect.

As shown in FIG. 9 (b), on the phase shift mask containing such defect, a silicon-containing resist 58 is applied. The film thickness of the resist 58 is 50 nm in the flat part of the transparent substrate 51. By defining this film thickness, a phase difference of 30 degrees is given to the transmission light. Herein, as the silicon-containing resist 58 for repair, the resist shown in FIG. 2 was used same as in the first embodiment. This resist 58 is exposed in the periphery, including the end A of the phase shifter 53 existing in the light transmission area, using an electron beam 59 at acceleration voltage of 20 kV. After exposure, it is developed by immersing in an aqueous solution of TMAH (concentration 8%) for 60 seconds. Since this silicon-containing resist is a negative resist, the pattern is left over only in the are a irradiated with electron beam 59.

In this process, the film thickness varies smoothly in the shape of the end A of the phase shifter 53 not desired to be projected as shown in FIG. 9 (c). As a result of exposure using the i-ray stepper with this phase shift mask, the end of the phase shifter projected on the resist before repair was not projected after repair, so that a desired pattern can be formed. By employing this method, the end of the phase shifter existing in the light transmission are a may not be projected as required. The silicon-containing resist 58 for repair used herein is defined in the film thickness of 50 nm for providing transmission light with a phase difference of 30 degrees. To repair the mask in this method, if the coat film thickness is too thin, the change quntity of the film thickness becomes sharp, and the pattern is projected. If the coating film thickness is too thick, on the other hand, the pattern is projected by the light passing through the end of the pattern formed for repair. Therefore, the coating film thickness of the resist for repair is preferred to be such a film thickness as to provide the transmission light with a phase difference of 10 degrees or more and 60 degrees or less.

In this embodiment, the film thickness of the photosensitive resin for repair is shown by converted into a phase difference given to the transmission light. The actual film thickness t of the photosensitive resin is expressed as follows.

$$t = \lambda \times \Delta / (n-1) \times 360$$

where n is the refractive index of the phase shifter, $\lambda$ is the wavelength of exposure light, and $\Delta$ is the phase difference (in degrees) given to the transmission light.

In the embodiment, as the resist for repair, the resist containing chemically amplified silicon and chloromethylated polydiphenyl siloxane shown in FIG. 2 were used, but other photosensitive resins may be also used. As the resist for use in repair, it is preferred to possess the following five conditions.

Firstly, a sensitivity to energy beam should be possessed. In particular, for exposing a fine pattern on a defect, it is desired to have a sensitivity to electron beam, ultraviolet ray, or ion beam. Furthermore, to define the exposure region to the defect area, a negative sensitivity is preferred.

Secondly, it is desired to be transparent to the exposure light of the exposure equipment using this phase shift mask, preferably with the transmissivity of 95% or more.

Thirdly, the resistance to exposure light of the exposure equipment using this phase shift mask should be high, preferably free from changes in the transmissivity, refractive index and film thickness after irradiation with exposure light dose of $10 \times 10^4$ J/cm$^2$.

Fourthly, a sufficient resistance to the chemicals used in mask cleaning should be desired, preferably having a resistance to hot concentrated sulfuric acid and mixed solution of hot concentrated sulfuric acid and nitric acid.

Fifthly, the refractive index should be close to that of a transparent substrate.

It is, however, rather difficult to satisfy all these conditions, and at least it is enough to satisfy the first and second conditions.

Examples of such resist include, among others, polymethyl methacrylate (PMMA) as positive resist, and chloromethylated styrene (CMS) as negative resist.

To satisfy all of the first to fifth conditions at the same time, a resist mainly composed of a polymer possessing siloxane coupling (—SiO—O—) in the principal chain skeleton is desired. As such resist, aside from the resist containing chemically amplified silicon in FIG. 2, a polymer having a photosensitive group inducing cross-linking reaction by radiation, such as chloromethyl group, ally group and vinyl group in the side chain may be used. An example possessing chloromethyl group is shown in FIG. 10 (a), an example possessing an allyl group in FIG. 10 (b), and an example possessing a vinyl group in FIG. 10 (c).

Figure 10A:
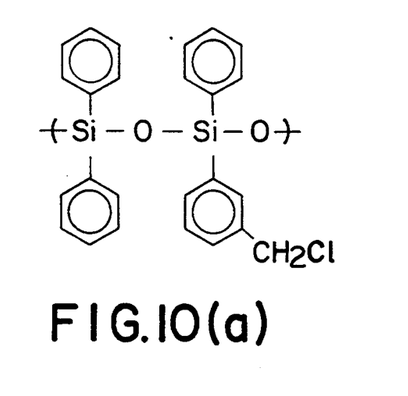
FIGS. 10(a)(b)(c)(d)(e) shows a chemical formula of a resist usable as a phase shifter.
Figures 10B, 10D:
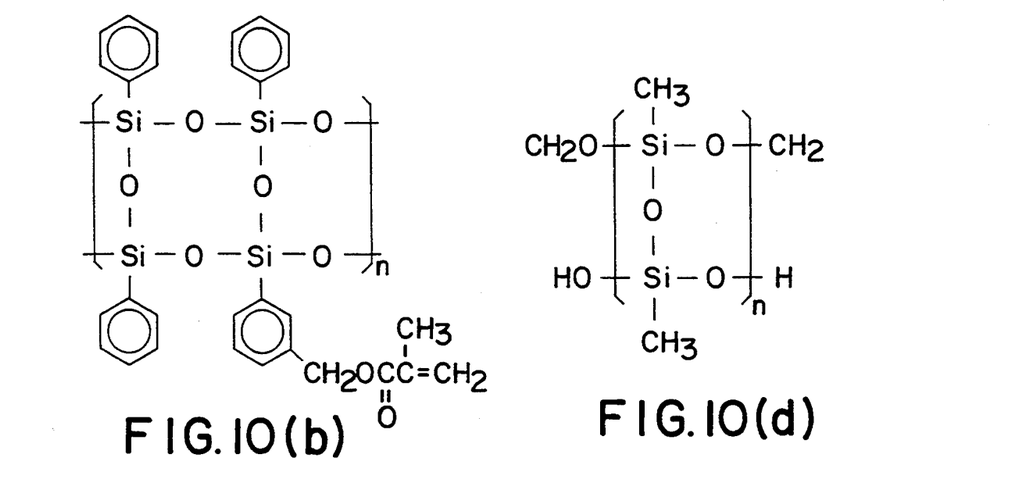
Figure 10C:
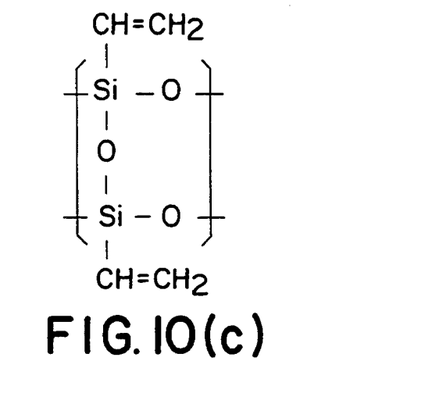

It is also possible to use a resist composed of siloxane polymer possessing a hydroxy methyl group in the side chain, and an oxygen generator. This example is shown in FIG. 10 (d).

Figure 10E:
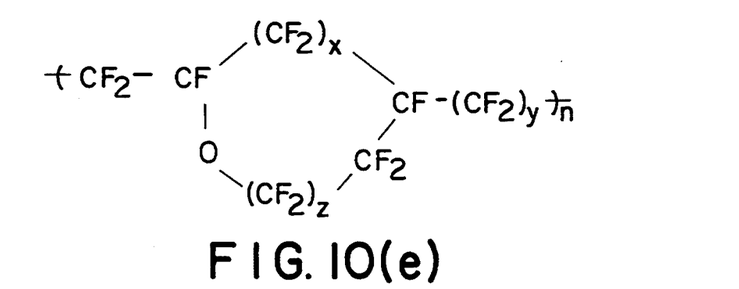

As other polymer, for example a resist composed of a photosensitive freon resin that can be applied by spinning may be used. The resist mainly composed of a polymer of which principal chain skeleton is fluorocarbon (—CFxHy—) is high in chemical resistance and high in transparency, and can be hence used. This example is shown in FIG. 10 (e).

Although the present invention has been described in considerable detail with reference to certain preferred versions thereof, other versions are possible.

The phase shift mask described in the foregoing embodiments of the invention is designed so that the transmission light in the adjacent openings may have a phase difference of 180 degrees to each other. The phase shift mask in such structure is called a Levenson type phase shift mask. There are other types of phase shift mask, including the rim type phase shift mask (self-matched phase shift mask) having phase shifters provided around the opening in a specific width, the transmission type phase shift mask (chrome-less type phase shift mask)

composed of only phase shift pattern without having light-shield film, and the half-tone type phase shift mask lowered in the transmissivity of the transmission light of phase shifter. These phase shift masks also form patterns of phase shifter for providing the transmission light with a phase difference on the phase shift mask. Accordingly, the repair method of the phase shift mask explained in the embodiments can be similarly applied to these masks without any difference. As clear from the description herein, using the photo mask of the invention, defects of the phase shift photo mask can be repaired in a simple manner.

Therefore, the spirit and scope of the appended claims should not be limited to the description of the preferred versions contained herein.

What is claimed is:

1. A photo mask comprising:
   a transparent substrate,
   a light-shield film pattern formed on said transparent substrate;
   a transparent film for providing transmission light with a phase difference formed on said transparent substrate, said transparent film having a defect, and
   a transparent photosensitive resin permanently formed on at least said defect defined in such a film thickness as to provide transmission light with a desired phase difference and retained on said defect after manufacturing of the photo mask is complete.

2. A photo mask according to claim 1, wherein said transparent photosensitive resin is defined in such a film thickness as to provide transmission light with a phase difference of up to 90 degrees.

3. A photo mask according to claim 1, wherein said transparent photosensitive resin is defined in such a film thickness as to provide transmission light with a phase difference from 300 degrees to 420 degrees.

4. A photo mask according to claim 1, wherein said transparent photosensitive resin is defined in such a film thickness as to provide transmission light with a phase difference from 120 degrees to 240 degrees.

5. A photo mask according to claim 1, wherein said transparent photosensitive resin is a resin mainly composed of silicon.

6. A photo mask according to claim 1, wherein said transparent photosensitive resin is a resin mainly composed of siloxane polymer and oxygen generator.

7. A photo mask comprising:
   a transparent substrate,
   a light-shield film pattern formed on said transparent substrate,
   a transparent film for providing transmission light with a phase difference formed on said transparent substrate, said transparent film having a region with a dent defect, and
   a transparent photosensitive resin permanently formed on said region defined in such a film thickness as to provide transmission light with a desired phase difference and retained on said dent defect after manufacturing of the photo mask is complete.

8. A photo mask comprising:
   a transparent substrate,
   a light-shield film pattern formed on said transparent substrate,
   a transparent film for providing transmission light with a phase difference formed on said transparent substrate, said transparent film having a dent defect, and
   a transparent photosensitive resin permanently formed on and completely covering said dent defect defined in such a film thickness as to provide transmission light with a desired phase difference and retained on said dent defect after manufacturing of the photo mask is complete.

9. A method of repairing a photo mask comprising the steps of:
   applying a transparent photosensitive resin on a photo mask, said photo mask comprising a light-shield film pattern and a transparent film, formed on a transparent substrate, said transparent film for providing transmission light with a phase difference, said transparent film having a defect,
   exposing a specified region of said transparent photosensitive resin, and
   developing said photosensitive resin to permanently form a photosensitive resin pattern on a substrate defined in such a film thickness as to provide transmission light with a desired phase difference and to repair said defect,
   maintaining said photosensitive resin on said defect after repair of the photo mask is complete.

10. The method according to claim 9, wherein said transparent photosensitive resin is defined in such a film thickness as to provide transmission light with a phase difference of up to 90 degrees.

11. The method according to claim 9, wherein said transparent photosensitive resin is defined in such a film thickness as to provide transmission light with a phase difference from 300 degrees to 420 degrees.

12. The method according to claim 9, wherein said transparent photosensitive resin is defined in such a film thickness as to provide transmission light with a phase difference from 120 degrees to 240 degrees.

13. The method according to claim 9, wherein said transparent photosensitive resin is a resin mainly composed of silicon.

14. The method of according to claim 9, wherein said transparent photosensitive resin is a resin mainly composed of siloxane polymer and oxygen generator.

* * * * *